United States Patent
Hamamoto et al.

(10) Patent No.: US 10,959,321 B2
(45) Date of Patent: Mar. 23, 2021

(54) AIR CONDITIONER

(71) Applicant: Mitsubishi Electric Corporation, Tokyo (JP)

(72) Inventors: Wataru Hamamoto, Tokyo (JP); Akira Okamoto, Tokyo (JP); Akihisa Sato, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/619,538

(22) PCT Filed: Aug. 2, 2017

(86) PCT No.: PCT/JP2017/028075
§ 371 (c)(1),
(2) Date: Dec. 5, 2019

(87) PCT Pub. No.: WO2019/026205
PCT Pub. Date: Feb. 7, 2019

(65) Prior Publication Data
US 2020/0154562 A1    May 14, 2020

(51) Int. Cl.
*H01R 12/00* (2006.01)
*H05K 1/02* (2006.01)
(Continued)

(52) U.S. Cl.
CPC ......... *H05K 1/0259* (2013.01); *F24F 1/0007* (2013.01); *H05K 1/0215* (2013.01);
(Continued)

(58) Field of Classification Search
CPC ...... H05K 1/0259; H05K 1/0215; H05K 1/18; H05K 5/0026; H05K 5/0286;
(Continued)

(56) References Cited

U.S. PATENT DOCUMENTS

2013/0173064 A1* 7/2013 Fadell ............... F24F 11/89
700/276
2017/0364105 A1* 12/2017 Greene ............ G05D 23/1904
(Continued)

FOREIGN PATENT DOCUMENTS

CN      105605738 A    5/2016
JP      S62-295293 A  12/1987
(Continued)

OTHER PUBLICATIONS

Office Action dated Oct. 15, 2020 issued in corresponding Australian patent application No. 2017425846.
(Continued)

*Primary Examiner* — Abdullah A Riyami
*Assistant Examiner* — Nelson R. Burgos-Guntin
(74) *Attorney, Agent, or Firm* — Posz Law Group, PLC

(57) ABSTRACT

An air conditioner includes an indoor equipment, a wiring connected to the indoor equipment at one end, and a communication interface connected to another end of the wiring and electrically connected to the indoor equipment via the wiring. The communication interface includes a housing made of resin, an insertion hole formed in the housing and into which a communication module of a cartridge type is inserted, and a control board provided inside the housing. The communication interface includes a first connector provided on a board surface of the control board and electrically connected to the communication module. The communication interface includes a pattern wiring provided on the board surface and discharging static electricity from the communication module before the communication module is electrically connected to the first connector.

3 Claims, 5 Drawing Sheets

(51) Int. Cl.
*F24F 1/0007* (2019.01)
*H05K 1/18* (2006.01)
*H05K 5/00* (2006.01)
*H05K 5/02* (2006.01)
*H01R 12/70* (2011.01)
*H01R 12/71* (2011.01)

(52) U.S. Cl.
CPC ............. H05K 1/18 (2013.01); H05K 5/0026 (2013.01); H05K 5/0286 (2013.01); *H01R 12/7076* (2013.01); *H01R 12/716* (2013.01); *H05K 2201/10189* (2013.01)

(58) Field of Classification Search
CPC ....... H05K 2201/10189; H05K 9/0079; H05K 5/0017; F24F 1/0007; F24F 11/89; F24F 11/88; F24F 2013/207; F24F 13/20; H01R 12/7076; H01R 12/716
USPC .......................................... 439/76.1, 630, 68
See application file for complete search history.

(56) References Cited

U.S. PATENT DOCUMENTS

2020/0018469 A1* 1/2020 Kohen ................... G08B 25/10
2020/0154562 A1* 5/2020 Hamamoto .......... H05K 1/0215

FOREIGN PATENT DOCUMENTS

| | | |
|---|---|---|
| JP | H01-107900 | 7/1989 |
| JP | H03-046970 | 4/1991 |

OTHER PUBLICATIONS

Office Action Nov. 2, 2020 issued in corresponding CN patent application No. 201780093496.3 (and English translation).

* cited by examiner

AIR CONDITIONER

CROSS REFERENCE TO RELATED APPLICATION

This application is a U.S. national stage application of International Patent Application No. PCT/JP2017/028075 filed on Aug. 2, 2017, the disclosure of which is incorporated herein by reference.

TECHNICAL FIELD

The present invention relates to an air conditioner including a communication interface and an indoor equipment.

BACKGROUND

A connector for a memory disclosed in Patent Literature 1 includes a connector body that is an interface into which a cartridge memory is inserted, and a slot that is formed in the connector body and into which the memory is inserted. The connector for a memory disclosed in Patent Literature 1 further includes a positioning spring that guides the memory inserted in the slot to a contact plug, and the contact plug that is electrically connected to the memory guided by the positioning spring. The memory is a cartridge module. The connector for a memory disclosed in Patent Literature 1 further includes a ground path connected to the connector body.

The positioning spring is an elastic metal plate. A screw is inserted into the connector body and the positioning spring to be screwed into a printed circuit board, whereby the connector is fixed to the printed circuit board and at the same time the positioning spring is fixed to the connector body. A conductive path is formed by the positioning spring fixed to the connector body and the screw, and the conductive path is grounded via the ground path.

When the cartridge module is inserted into the slot, a contact socket of the module is brought into contact with the positioning spring before connected to the contact plug in the connector body. Thus, static electricity charged in the module or static electricity flowing from a human body through the module is removed via the ground path. As a result, it is possible to prevent damage to a semiconductor element in the module and prevent malfunction and failure of a circuit built in a device to which a module connector is connected.

Patent Literature

Patent Literature 1: Japanese Patent Application Laid-open No. S62-295293

However, in the prior art disclosed in Patent Literature 1, a housing that forms the outer shell of the connector body is formed of resin. Therefore, the spring-like metal plate, screw, and ground path are required in order to remove static electricity, which results in problems that the number of parts is increased and the structure becomes complicated.

SUMMARY

The present invention has been made in view of the above, and aims to provide an air conditioner capable of removing static electricity with a simple configuration even when a housing of an interface into which a cartridge module is inserted is formed of resin.

In order to solve the above problems and achieve the object, an air conditioner of the present invention includes an indoor equipment, a wiring connected to the indoor equipment at one end, and a communication interface connected to another end of the wiring and electrically connected to the indoor equipment via the wiring. The communication interface includes a housing made of resin, an insertion hole formed in the housing and into which a communication module of a cartridge type is inserted, and a control board provided inside the housing. The communication interface includes a first connector provided on a board surface of the control board and electrically connected to the communication module. There is included a pattern wiring provided on the board surface and discharging static electricity from the communication module before the communication module is electrically connected to the first connector. The pattern wiring is electrically connected to ground of the indoor equipment via the wiring.

The air conditioner according to the present invention has an effect that static electricity can be removed with a simple configuration even when the housing of the interface into which the cartridge module is inserted is formed of resin.

DETAILED DESCRIPTION

An air conditioner according to an embodiment of the present invention will now be described in detail with reference to the drawings. Note that the present invention is not limited to the embodiment.

Embodiment

Figure 1:
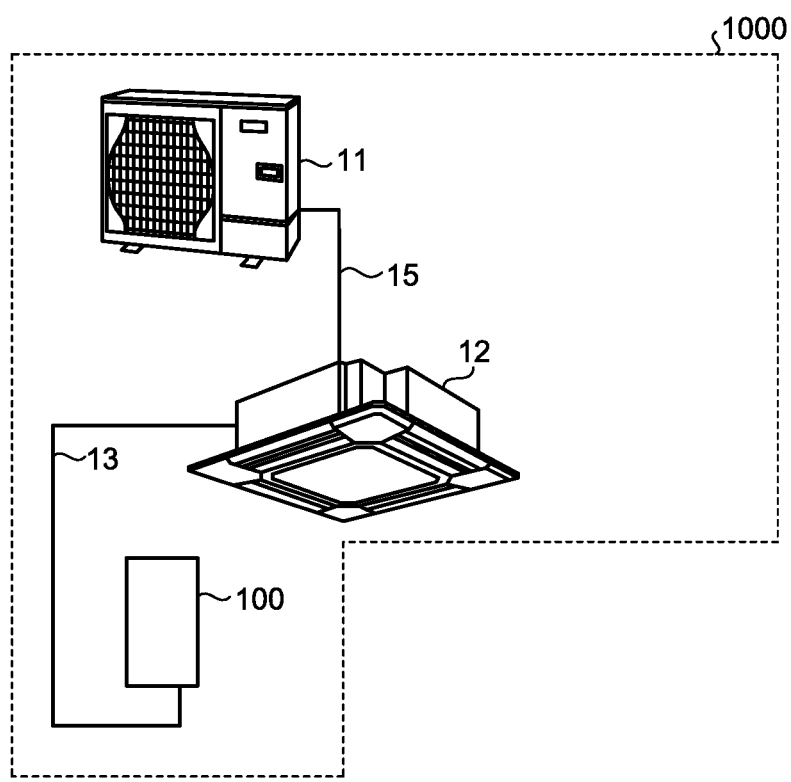
FIG. 1 is a diagram illustrating a configuration of an air conditioner according to an embodiment.

First, an overall configuration of an air conditioner 1000 according to an embodiment of the present invention will be described with reference to FIG. 1. FIG. 1 is a diagram illustrating a configuration of the air conditioner 1000 according to the embodiment. The air conditioner 1000 includes an outdoor unit 11, an indoor equipment 12, and a communication interface 100. Although the indoor equipment 12 of a ceiling cassette type is illustrated in FIG. 1, the type of the indoor equipment 12 is not limited to the ceiling cassette type but may be a ceiling suspended type, a wall hanging type, or a floor type. The outdoor unit 11 and the indoor equipment 12 are connected to each other by a refrigerant pipe 15 and a power supply wiring (not shown). The indoor equipment 12 is provided with a communication unit (not shown) for transmitting information to and from the communication interface 100. The information is transmitted between the communication interface 100 and the communication unit of the indoor equipment 12 via a wiring 13. Moreover, the power necessary for driving the communication interface 100 is supplied from the indoor equipment 12 to the communication interface 100.

The indoor equipment 12 includes a blower (not shown), a motor that drives the blower, an indoor heat exchanger (not shown), an expansion valve (not shown), a four-way valve, and an indoor control board. The outdoor unit 11 includes a blower (not shown), a first motor (not shown) that drives the blower, a compressor (not shown), a second motor that drives the compressor, an outdoor heat exchanger (not shown), and an outdoor control board (not shown). The four-way valve, the indoor heat exchanger, the expansion valve, the outdoor heat exchanger, and the refrigerant pipe 15 form a refrigeration cycle.

Figure 2:
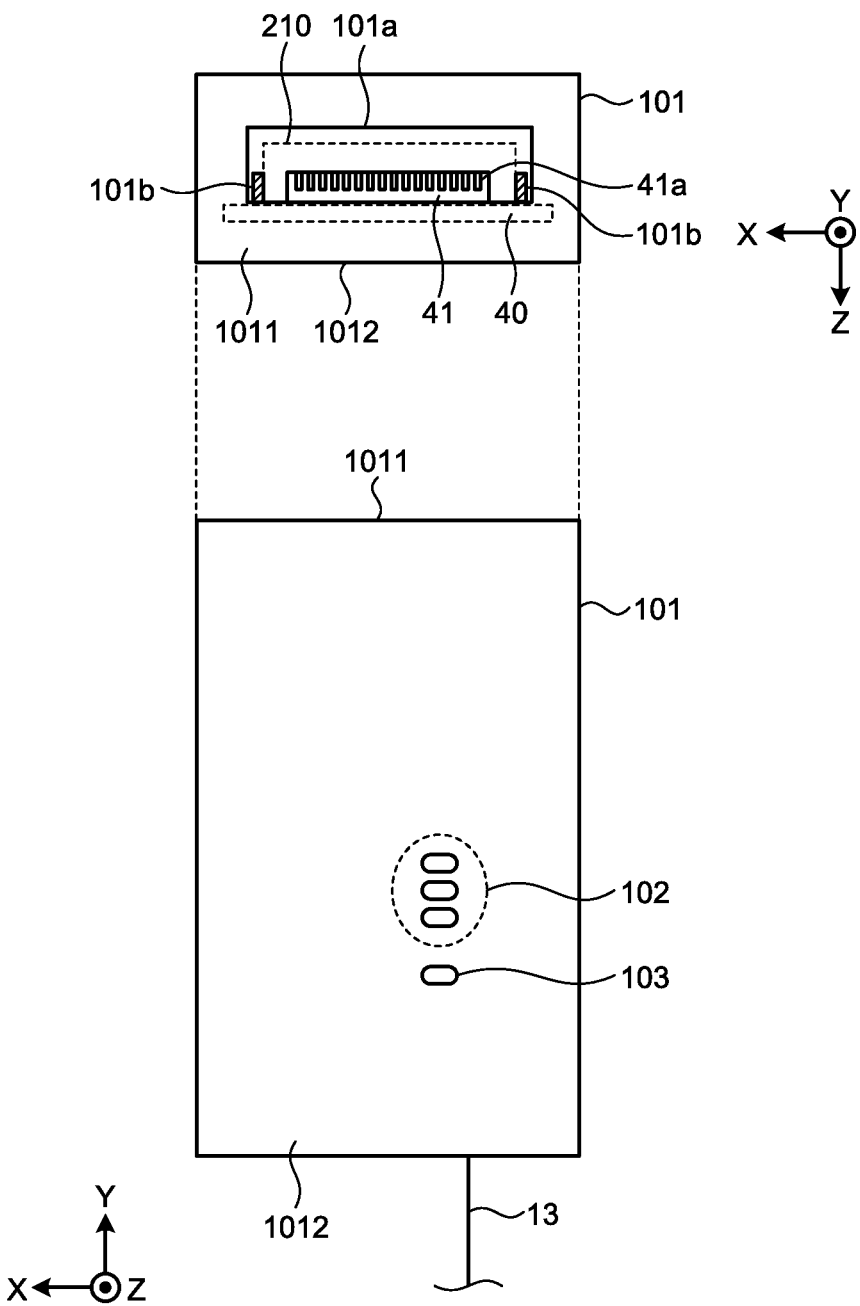
FIG. 2 is an external view of a communication interface included in the air conditioner according to the embodiment.
Figure 3:
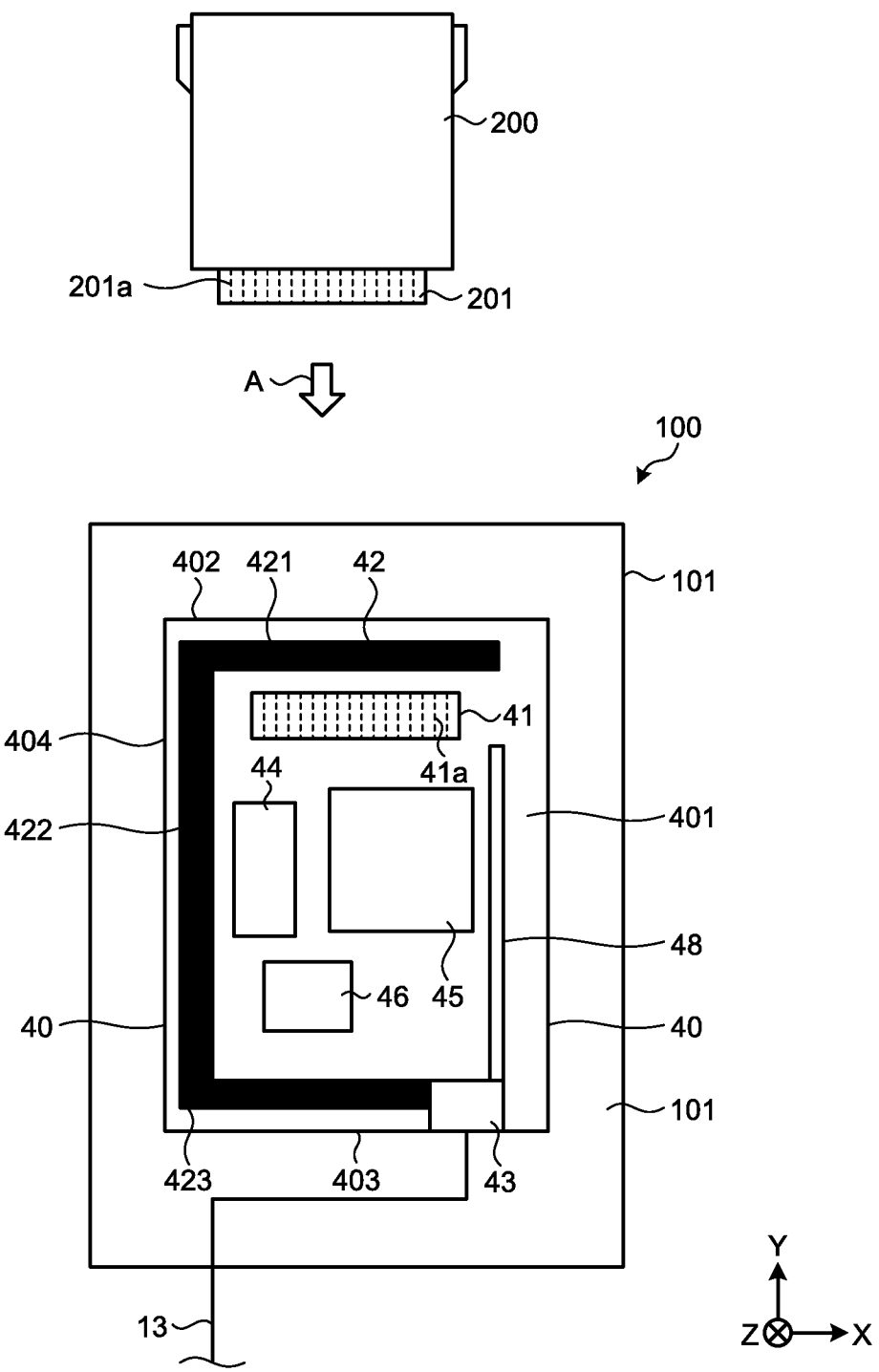
FIG. 3 is an internal view of the communication interface included in the air conditioner according to the embodiment, as viewed from the back side.

Next, a configuration of the communication interface 100 and a configuration of a communication module 200 inserted into the communication interface 100 will be described specifically with reference to FIGS. 2 and 3. FIG. 2 is an external view of the communication interface 100 included in the air conditioner according to the embodiment. FIG. 3 is an internal view of the communication interface 100 included in the air conditioner according to the embodiment, as viewed from the back side. FIG. 3 illustrates the communication interface 100 and the communication module 200 of a cartridge type. Note that in FIG. 3, arrow "A" pointing from the communication module 200 to the communication interface 100 indicates a direction in which the communication module 200 is inserted into an insertion hole 101a illustrated in FIG. 2.

As illustrated in FIG. 2, the communication interface 100 includes a housing 101 made of resin and having a rectangular shape, a display 102, and a reset switch 103. FIG. 2 uses left-handed XYZ coordinates to define a horizontal direction of the housing 101 as an X axis direction, a vertical direction of the housing 101 as a Y axis direction, and a depth direction of the housing 101 orthogonal to both the X axis direction and the Y axis direction as a Z axis direction. The housing 101 may be formed into the rectangular shape by combining a plurality of resinous plate materials, or by combining resinous plate materials with both ends of a resinous tube member that is formed into a tubular shape by integral molding.

As illustrated on the upper side of FIG. 2, the insertion hole 101a is formed in one end surface 1011 of the housing 101 in the Y axis direction. The insertion hole 101a is an opening for inserting the communication module 200 illustrated in FIG. 3 into the housing 101. The area of opening of the insertion hole 101a on the XZ plane is larger than the area of a region 210 formed by projecting the communication module 200 illustrated in FIG. 3 in the Y axis direction. Note that the position where the insertion hole 101a is formed on the one end surface 1011 may be a position where a connector 201 of the communication module 200 can be connected to a first connector 41 illustrated in FIG. 3, and is not limited to the center of the one end surface 1011. Alternatively, the insertion hole 101a may be formed at a position other than the one end surface 1011 of the housing 101 in the Y axis direction as long as the connector 201 of the communication module 200 can be connected to the first connector 41.

As illustrated in FIG. 2, a control board 40 and a pair of guides 101b are provided inside the housing 101. FIG. 2 uses a dotted line to indicate the shape of the control board 40 in a plan view of the XZ plane viewed from the Y axis direction.

As illustrated in FIG. 3, the first connector 41, a pattern wiring 42 for electrostatic discharge, and a second connector 43 are provided on one board surface 401 of the control board 40 in the Z axis direction. The board surface 401 is also provided with a first power supply circuit 44 for supplying power to the communication module 200, a control circuit 45 for controlling the operation of the communication interface 100, a second power supply circuit 46 for supplying power to the control circuit 45, and a ground pattern wiring 48.

The first connector 41 is a connector that is electrically connected to the connector 201 and to the control circuit 45. Specifically, the first connector 41 is provided with a plurality of terminals 41a, each of which is a conductive terminal extending in the Y axis direction. The plurality of terminals 41a is spaced apart from one another in the X axis direction. Each of the plurality of terminals 41a is electrically connected to each of terminals 201a provided in the communication module 200 illustrated in FIG. 3, and is also electrically connected to the control circuit 45. Each of the plurality of terminals 201a is a conductive terminal extending in the Y axis direction. The plurality of terminals 201a is spaced apart from one another in the X axis direction.

The pattern wiring 42 is a wiring for discharging static electricity to the wiring 13 by being close to the terminals 201a of the communication module 200 before the connector 201 is electrically connected to the first connector 41. The static electricity is static electricity charged in the communication module 200 or static electricity flowing from a human body via the communication module 200. The pattern wiring 42 is electrically connected to the ground pattern wiring 48 via the second connector 43. Specifically, the pattern wiring 42 includes a first pattern wiring 421, a second pattern wiring 422, and a third pattern wiring 423. The first pattern wiring 421 is a pattern wiring extending in the X axis direction. The first pattern wiring 421 is provided between one end 402 of the control board 40 in the Y axis direction and the first connector 41. The second pattern wiring 422 is a pattern wiring extending in the Y axis direction from an end of the first pattern wiring 421 in the X axis direction. The second pattern wiring 422 is provided near one end 404 of the control board 40 in the X axis direction. The third pattern wiring 423 is a pattern wiring extending in the X axis direction from an end of the second pattern wiring 422 in the Y axis direction. The third pattern wiring 423 is provided near another end 403 of the control board 40 in the Y axis direction. The third pattern wiring 423 is electrically connected to the wiring 13 via the second connector 43.

Note that the shape of the pattern wiring 42 is not limited to the one in the illustrated example. The positions of the second pattern wiring 422 and the third pattern wiring 423 may also be different from those in the illustrated example as long as the first pattern wiring 421 provided between the one end 402 of the control board 40 in the Y axis direction and the first connector 41 is electrically connected to the wiring 13 via the second connector 43. Moreover, although the pattern wiring 42 is electrically connected to the ground pattern wiring 48 provided on the control board 40 via the second connector 43, the second pattern wiring 422 and the third pattern wiring 423 may be used as ground wiring in a case where the ground pattern wiring 48 cannot be provided due to the area of the control board 40 on the XY plane being small. Furthermore, the resist may be removed from the pattern wiring 42 in order to facilitate discharge of static electricity from the communication module 200 to the first pattern wiring 421.

Note that in a case where the control board 40 is a double-sided board, the pattern wirings 42 may be provided on both sides of the control board 40 and connected by many vias, in order to lower the impedance of the pattern on the control board 40 and make it easier for static electricity from the connector 201 to jump to the pattern wiring 42. In a case where the control board 40 is a multilayer board, the pattern wiring 42 may be provided in each of a plurality of inner layers provided on the inner side of the multilayer board in the stacking direction, and the pattern wirings 42 may be connected by vias. Moreover, in order to prevent secondary discharge from the pattern wiring 42 to a wiring pattern (not shown) provided around the pattern wiring 42, it is desirable to secure a separation between the wiring pattern and the pattern wiring 42 in accordance with a voltage level of the electrostatic discharge to be prevented.

The second connector 43 is a connector for electrically connecting to the pattern wiring 42, the wiring 13, and the ground pattern wiring 48.

The control circuit 45 receives power supplied from the second power supply circuit 46 and performs communication with the indoor equipment 12 and the communication module 200. The control circuit 45 also controls the lighting pattern of the display 102 in order to notify a user of a status of communication with the indoor equipment 12 and the communication module 200. The control circuit 45 also replaces a demand signal, which is transmitted between the communication module 200 and a power meter described above and conforms to a first communication protocol, with a demand signal which is transmitted between the communication interface 100 and the indoor equipment 12 and conforms to a second communication protocol. As a specific example, the communication module 200 and the power meter can use various types of communication methods. Therefore, depending on the environment in which the air conditioner 1000 is installed, the communication module 200 and the power meter may use a communication method different from a communication method used between the communication interface 100 and the indoor equipment 12. When there is such a difference in communication method, the demand signal transmitted from a power company cannot be transmitted to the indoor equipment 12. In order to solve such a problem, the control circuit 45 replaces the demand signal, which is transmitted between the communication module 200 and the power meter and conforms to the first communication protocol, with the demand signal which is transmitted between the communication interface 100 and the indoor equipment 12 and conforms to the second communication protocol. When the air conditioner 1000 is in the cooling operation, for example, the indoor equipment 12 that has received the demand signal operates to suppress the operation of the compressor by increasing the set temperature.

The ground pattern wiring 48 is a ground wiring for the first power supply circuit 44, the control circuit 45, and the second power supply circuit 46. The ground pattern wiring 48 is connected to the second connector 43. The ground pattern wiring 48 is grounded to a frame ground of the indoor equipment 12 via the second connector 43 and the wiring 13. That is, the ground pattern wiring 48 is electrically connected to the frame ground of the indoor equipment 12.

The wiring 13 is electrically connected to the first power supply circuit 44 and the second power supply circuit 46 via the second connector 43. Power to the first power supply circuit 44 and the second power supply circuit 46 is supplied from the indoor equipment 12 via the wiring 13 and the second connector 43.

The wiring 13 is also connected to a ground pattern wiring 48 on a control circuit board (not shown) in the indoor equipment 12. The ground pattern wiring 48 is electrically connected to the frame ground of the indoor equipment 12. Therefore, the pattern wiring 42 and the ground pattern wiring 48 connected to the second connector 43 are grounded via the wiring 13, the ground pattern wiring 48 on the control circuit board in the indoor equipment 12, and the frame ground.

The pair of guides 101b illustrated in FIG. 2 has a function of guiding, to the first connector 41, the communication module 200 that is inserted into the housing 101 through the insertion hole 101a. The pair of guides 101b is spaced apart from each other in the X axis direction.

The display 102 includes three light emitting diodes (LEDs). The display 102 is provided on one end surface of the housing 101 in the Z axis direction, that is, on a front surface 1012 of the housing 101. The display 102 is a light emitter for notifying a user of the status of communication between the communication interface 100 and the indoor equipment 12 illustrated in FIG. 1 by the lighting pattern of the three LEDs. Specifically, the three LEDs are turned off when communication is not performed between the communication interface 100 and the indoor equipment 12. The three LEDs are lit in order from the top when communication is performed between the communication interface 100 and the indoor equipment 12. Moreover, the three LEDs blink at a fixed cycle when the wiring 13 connecting the communication interface 100 and the indoor equipment 12 is disconnected. By changing the lighting pattern of the LEDs in such a manner, a user can grasp the status of communication between the communication interface 100 and the indoor equipment 12, and can grasp whether or not the wiring 13 is disconnected.

Note that the lighting patterns of the LEDs are not limited to the above as long as a user can visually identify the status of communication between the communication interface 100 and the indoor equipment 12, and visually identify whether or not the wiring 13 is disconnected. The position of the display 102 is not limited to the front surface 1012 of the housing 101 as long as a user can visually identify the lighting pattern of the LEDs. The number of LEDs included in the display 102 is not limited to three as long as a user can visually identify the status of communication between the communication interface 100 and the indoor equipment 12, and visually identify whether or not the wiring 13 is disconnected. Moreover, the light emitter included in the display 102 is not limited to the LED as long as it can change the lighting pattern.

The reset switch 103 is used to restart the communication interface 100 and to initialize the settings of the communication interface 100 at the time of shipment from the factory. Note that the position of the reset switch 103 is not limited to the front surface 1012 of the housing 101 as long as the reset switch 103 can be operated.

The communication module 200 illustrated in FIG. 3 includes a communication circuit (not shown). The communication circuit is a circuit for performing wired or wireless communication with the power meter (not shown). As a wireless communication standard applied to the communication circuit, a known standard such as Wi-Fi (registered trademark), ZigBee (registered trademark), or Bluetooth (registered trademark) Low Energy (BLE) may be used, or a unique standard may be used. Examples of the wired communication standard applied to the communication circuit include Ethernet (registered trademark) standardized by IEEE 802.3 and RS485 communication. The power meter is a demand meter or a smart meter including a function of communicating with the communication module 200. A demand signal transmitted from a power company is received by the communication circuit of the communication module 200 via the power meter. The demand signal is a signal for controlling the air conditioner 1000 so as to reduce an increase in power consumption accompanying the operation of the air conditioner 1000. When the communication module 200 is connected to the first connector 41, the communication circuit of the communication module 200 outputs the received demand signal to the control circuit 45 via the first connector 41.

Figure 4:
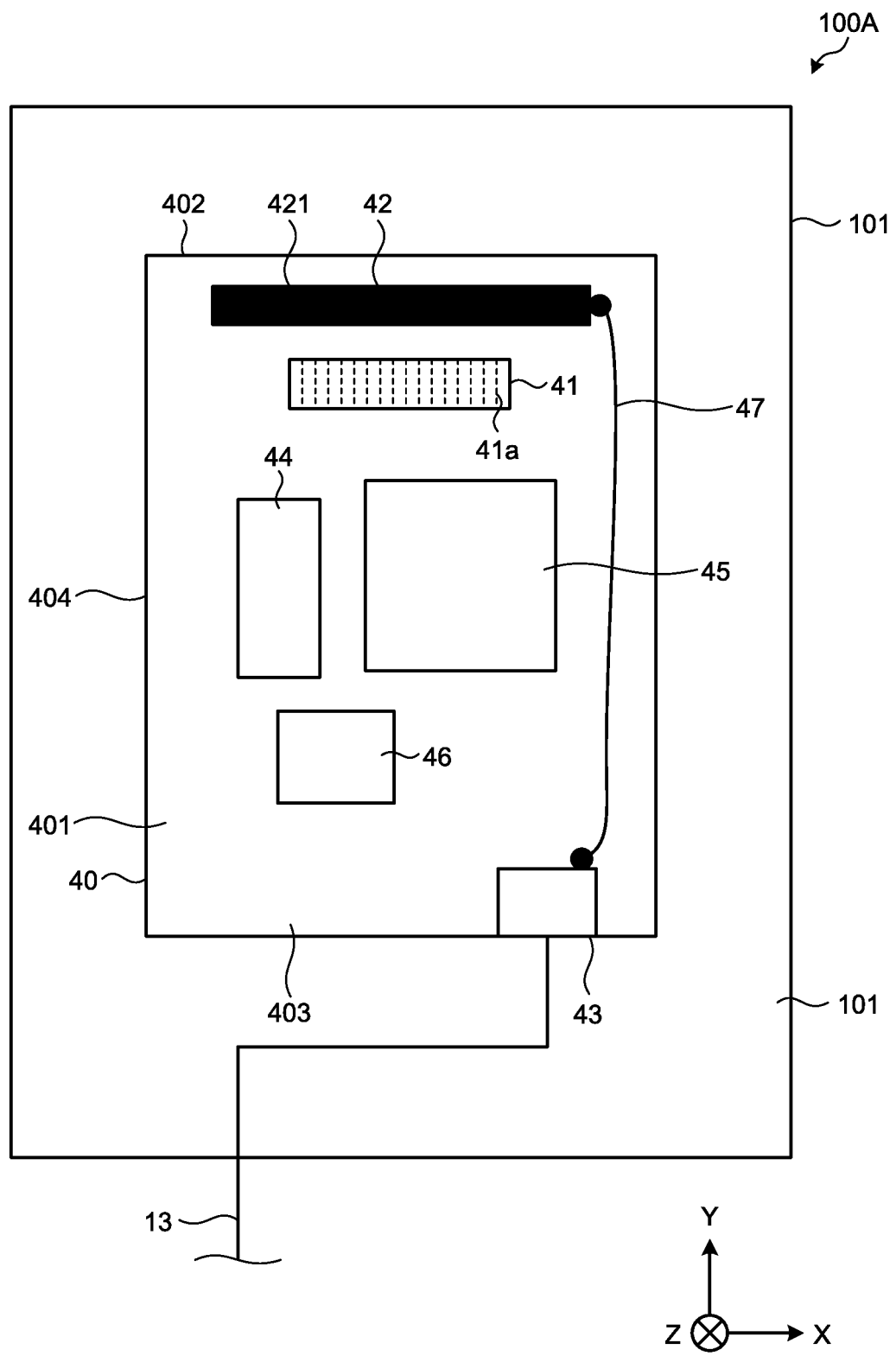
FIG. 4 is a diagram illustrating a first variation of the communication interface included in the air conditioner according to the embodiment.

Next, a configuration of a variation of the communication interface 100 will be described with reference to FIGS. 4 and 5. FIG. 4 is a diagram illustrating a first variation of the communication interface 100 included in the air conditioner according to the embodiment. A communication interface 100A illustrated in FIG. 4 includes a lead wire 47 instead of the second pattern wiring 422 and the third pattern wiring 423 illustrated in FIG. 3.

In the communication interface 100 illustrated in FIG. 3, the first pattern wiring 421 is electrically connected to the second connector 43 via the second pattern wiring 422 and the third pattern wiring 423. However, when the area of the control board 40 on the XY plane cannot be increased because the housing 101 is small in size, the second pattern wiring 422 and the third pattern wiring 423 cannot be provided as in the illustrated example in some cases. When the second pattern wiring 422 and the third pattern wiring 423 cannot be provided on the control board 40 as in the above case, the lead wire 47 illustrated in FIG. 4 may be used instead of the second pattern wiring 422 and the third pattern wiring 423. Examples of the material of the lead wire 47 include aluminum, iron, copper, and silver.

As illustrated in FIG. 4, the first pattern wiring 421 forming the pattern wiring 42 is provided between the one end 402 of the control board 40 in the Y axis direction and the first connector 41. One end of the lead wire 47 is connected to the first pattern wiring 421, and another end of the lead wire 47 is connected to the second connector 43. The first pattern wiring 421 is electrically connected to the wiring 13 via the lead wire 47 and the second connector 43.

Figure 5:
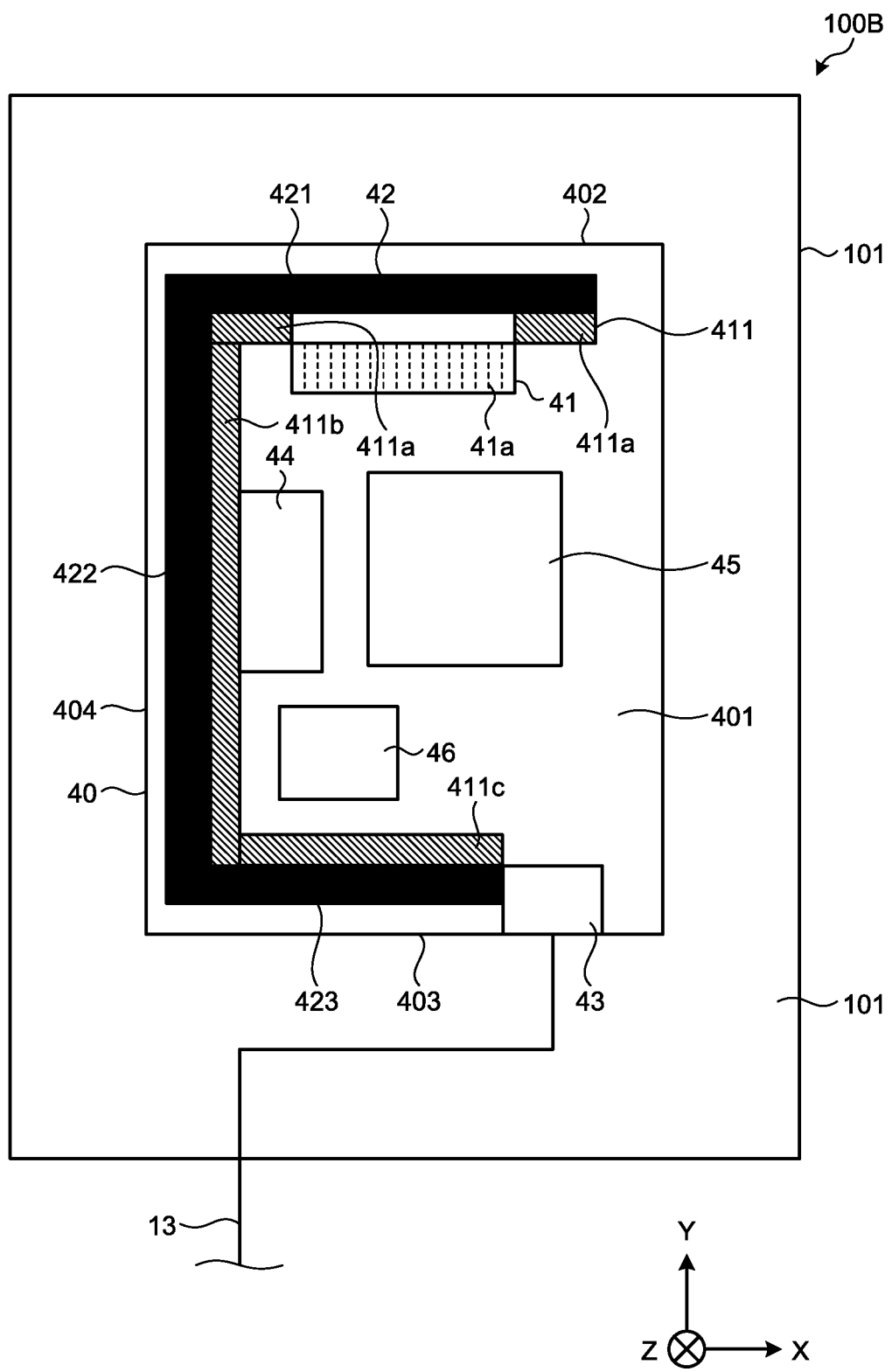
FIG. 5 is a diagram illustrating a second variation of the communication interface included in the air conditioner according to the embodiment.

FIG. 5 is a diagram illustrating a second variation of the communication interface 100 included in the air conditioner according to the embodiment. The control board 40 of a communication interface 100B illustrated in FIG. 5 is provided with a rib 411 made of resin in addition to the first connector 41, the pattern wiring 42, the second connector 43, the first power supply circuit 44, the control circuit 45, and the second power supply circuit 46.

The higher the voltage level of electrostatic discharge to be suppressed and the smaller the area of the control board 40 on the XY plane, the higher the possibility that the aforementioned secondary discharge occurs. In order to prevent the occurrence of such secondary discharge, the rib 411 made of resin is provided on the control board 40 illustrated in FIG. 5. The rib 411 is an insulating barrier that is erected on the control board 40 so as to block a line of sight between the pattern wiring 42 and a wiring pattern (not shown) provided near the pattern wiring 42. The rib 411 includes a first rib 411a provided on a side of the first pattern wiring 421 corresponding to the first connector 41, a second rib 411b provided on a side of the second pattern wiring 422 corresponding to the first power supply circuit 44, and a third rib 411c provided on a side of the third pattern wiring 423 corresponding to the second power supply circuit 46.

The rib 411 is formed by fixing a resin plate member in a slit (not shown) formed in the control board 40.

As described above, in the communication interfaces 100, 100A, and 100B of the air conditioner 1000 according to the embodiment, the pattern wiring 42 for electrostatic discharge is provided in front of the first connector 41. Thus, when the communication module 200 is inserted into the insertion hole 101a of the communication interface 100, the distance from the terminals 201a of the communication module 200 to the first pattern wiring 421 is shorter than the distance from the terminals 201a of the communication module 200 to the terminals 41a of the first connector 41. The terminals 201a of the communication module 200 are thus electrically connected to the terminals 41a of the first connector 41 before being electrically connected to the first connector 41. As a result, the static electricity charged in the communication module 200 is discharged to the first pattern wiring 421 before being discharged to the terminals 41a of the first connector 41, and the static electricity is discharged so that malfunction and failure of a component on the control board 40 are prevented, and damage to a semiconductor element in the communication module 200 is also prevented.

The configuration illustrated in the above embodiment merely illustrates an example of the content of the present invention, and can thus be combined with another known technique or partially omitted and modified without departing from the scope of the present invention.

The invention claimed is:

1. An air conditioner comprising:
an indoor equipment;
a wiring connected to the indoor equipment at one end; and
a communication interface connected to another end of the wiring and electrically connected to the indoor equipment via the wiring, wherein
the communication interface includes:
a housing made of resin;
an insertion hole formed in the housing and into which a communication module of a cartridge type is inserted;
a control board provided inside the housing;
a first connector provided on a board surface of the control board to be electrically connected to the communication module; and
a pattern wiring provided on the board surface to discharge static electricity from the communication module before the communication module is electrically connected to the first connector, wherein the pattern wiring is patterned on the board surface between one end of the control board and the first connector, and
the pattern wiring is electrically connected to ground of the indoor equipment via the wiring.

2. The air conditioner according to claim 1, wherein
the control board is provided with a ground pattern wiring electrically connected to the pattern wiring, and
the ground pattern wiring is electrically connected to the ground of the indoor equipment via the wiring.

3. The air conditioner according to claim 1, wherein
the pattern wiring includes at least a first pattern wiring that extends linearly along an X axis direction of the board surface, and the first pattern wiring is disposed on the board surface between one end of the control board in a Y axis direction of the board surface and the first connector.

* * * * *